US012617284B2

(12) United States Patent
Okada et al.

(10) Patent No.: US 12,617,284 B2
(45) Date of Patent: May 5, 2026

(54) POWER SUPPLY SYSTEM

(71) Applicant: TOYOTA JIDOSHA KABUSHIKI KAISHA, Toyota (JP)

(72) Inventors: Masahide Okada, Nagoya (JP); Hirotaka Sato, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 18/902,988

(22) Filed: Oct. 1, 2024

(65) Prior Publication Data

US 2025/0236176 A1     Jul. 24, 2025

(30) Foreign Application Priority Data

Jan. 23, 2024     (JP) ................................. 2024-007850

(51) Int. Cl.
*B60K 35/28*          (2024.01)
*B60K 35/10*          (2024.01)
*G01R 19/165*        (2006.01)

(52) U.S. Cl.
CPC .............. *B60K 35/28* (2024.01); *B60K 35/10* (2024.01); *G01R 19/16571* (2013.01); *B60K 2360/178* (2024.01)

(58) Field of Classification Search
CPC .. B60K 35/28; B60K 35/10; B60K 2360/178; G01R 19/16571
See application file for complete search history.

(56) References Cited

U.S. PATENT DOCUMENTS

| | | | | |
|---|---|---|---|---|
| 5,943,203 | A * | 8/1999 | Wang ....................... | H02H 3/07 361/103 |
| 6,068,352 | A * | 5/2000 | Kulkarni ................. | B60T 13/74 303/3 |
| 8,138,704 | B2 * | 3/2012 | Chakrabarti .......... | B60L 3/0092 318/434 |
| 10,641,802 | B2 * | 5/2020 | Petrie ..................... | G01R 15/20 |
| 2006/0255766 | A1 * | 11/2006 | Yoon ................... | H01M 10/441 320/128 |
| 2009/0174979 | A1 * | 7/2009 | Yang .................... | H05B 39/041 361/100 |
| 2011/0043958 | A1 | 2/2011 | Nakamura et al. | |
| 2012/0081825 | A1 | 4/2012 | Nakamura et al. | |
| 2012/0245794 | A1 * | 9/2012 | Aragai ..................... | H02J 1/14 701/36 |
| 2017/0214070 | A1 * | 7/2017 | Wang ................. | G01R 19/0092 |
| 2022/0311271 | A1 * | 9/2022 | Kitamoto ............... | B60L 55/00 |
| 2023/0073390 | A1 * | 3/2023 | Namuduri ............. | H02H 6/005 |

(Continued)

FOREIGN PATENT DOCUMENTS

| | | | | |
|---|---|---|---|---|
| CN | 203386997 | U | * | 1/2014 |
| CN | 209795288 | U | * | 12/2019 |

(Continued)

*Primary Examiner* — Chico A Foxx
(74) *Attorney, Agent, or Firm* — SoraIP, Inc.

(57) ABSTRACT

In a power supply system mounted on a vehicle, a connection unit allows a user to connect a load (external load). The power supply unit supplies power to the load via the connection unit. The current detection unit (first current detection unit) detects a current flowing from the power supply unit to the load. The notification unit notifies the user of the attention information when the detected current is equal to or larger than the rated current.

4 Claims, 2 Drawing Sheets

(56) References Cited

U.S. PATENT DOCUMENTS

| 2023/0204637 A1* | 6/2023 | Boury | G01R 19/2513 |
| | | | 324/500 |
| 2024/0266838 A1* | 8/2024 | Kim | H02J 7/02 |
| 2025/0018887 A1* | 1/2025 | Rogers | H02J 7/0013 |
| 2025/0233420 A1* | 7/2025 | Omohundro | B60L 58/12 |
| 2025/0258206 A1* | 8/2025 | Boury | G01R 19/2513 |

FOREIGN PATENT DOCUMENTS

| CN | 211642070 U | * | 10/2020 | |
| JP | 2010-119261 A | | 5/2010 | |
| JP | 2010-158108 A | | 7/2010 | |
| JP | 2010-283977 A | | 12/2010 | |
| JP | 2015-037940 A | | 2/2015 | |
| KR | 20130021788 A | * | 3/2013 | B60T 13/746 |

* cited by examiner

POWER SUPPLY SYSTEM

CROSS-REFERENCE TO RELATED APPLICATION

This application claims priority to Japanese Patent Application No. 2024-007850 filed on Jan. 23, 2024, incorporated herein by reference in its entirety.

BACKGROUND

1. Technical Field

The present disclosure relates to an in-vehicle power supply system.

2. Description of Related Art

Japanese Unexamined Patent Application Publication No. 2015-37940 (JP 2015-37940 A) discloses a protection device for a load circuit that detects a current flowing through a load provided in a vehicle and blocks a load circuit on the basis of the detected current.

SUMMARY

Meanwhile, a typical vehicle is provided with a connection unit to which a user can connect an electric load, and power can be supplied from the vehicle to the electric load connected to the connection unit. The connection unit includes, for example, a cigarette socket. A rated current is defined for the connection unit. However, the user may connect a load that causes a current equal to or greater than the rated current to flow to the connection unit.

An object of the present disclosure is to provide a technology capable of dealing with a situation in which a user connects a load that consumes a large amount of current to a connection unit of a vehicle.

In order to solve the above problem, a power supply system according to an aspect of the present disclosure
   is mounted in a vehicle and includes:
   a connection unit to which a user is able to connect a load;
   a power supply unit that supplies power to the load via the connection unit;
   a current detection unit that detects a current flowing from the power supply unit to the load; and
   a notification unit that notifies the user of caution information when the detected current is equal to or greater than a rated current.

According to the present disclosure, it is possible to provide a technology capable of dealing with a situation in which a user connects a load that consumes a large amount of current to a connection unit of a vehicle.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

Figure 1:
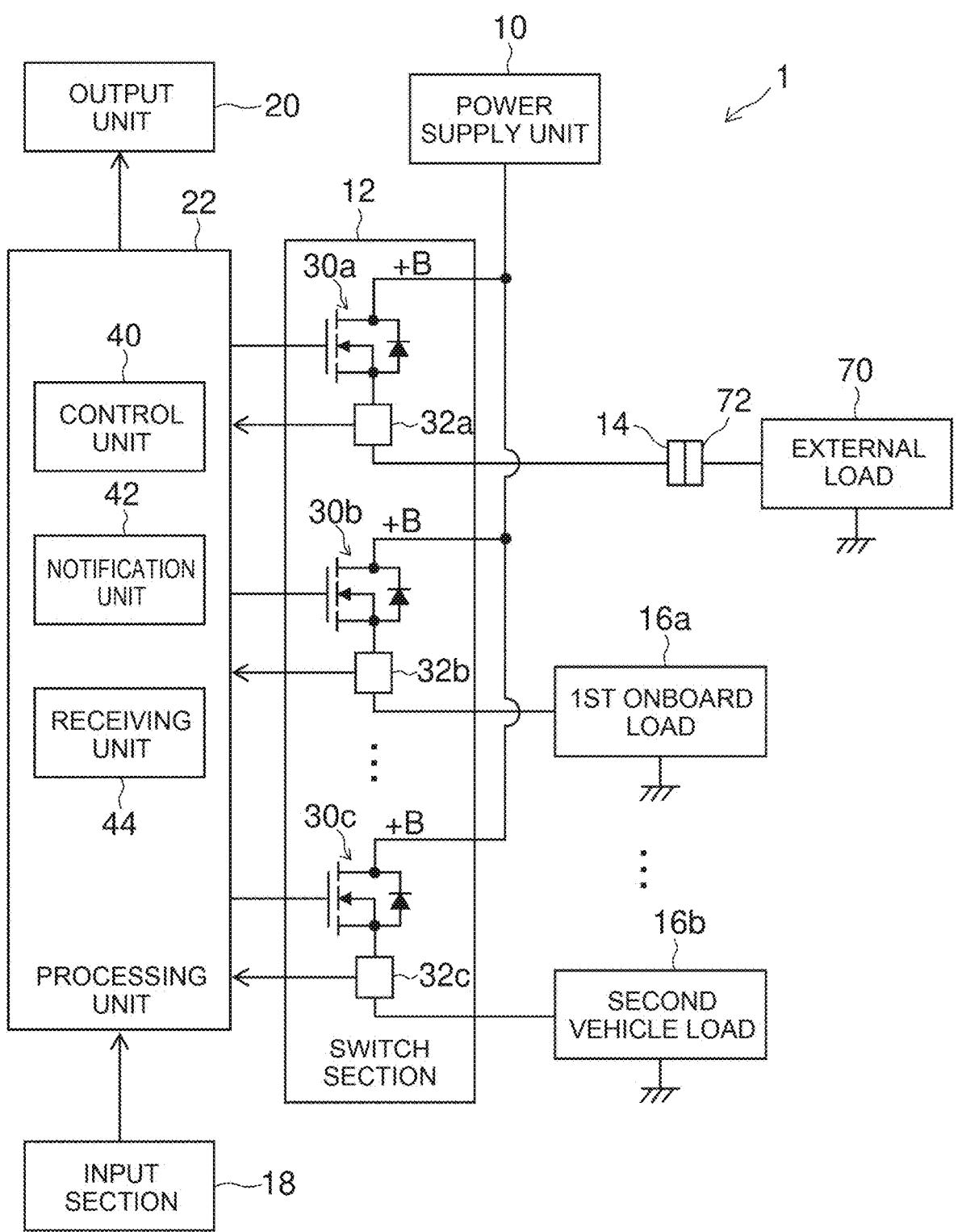
FIG. 1 is a diagram schematically illustrating a configuration of a power supply system according to an embodiment.

FIG. 1 schematically illustrates a configuration of a power supply system 1 according to an embodiment. The power supply system 1 is mounted on a vehicle (not shown) and supplies electric power to various electric loads. The vehicle may be a vehicle that uses only an internal combustion engine as a traveling driving force source, or may be an electrified vehicle that uses an electric motor as a traveling driving force source. Electrified vehicles are, for example, battery electric vehicle (BEV), hybrid electric vehicle (HEV), plug-in hybrid electric vehicle (PHEV), or fuel cell electric vehicle (FCEV). The vehicle may be a vehicle driven by a driver or an autonomous vehicle.

As illustrated in FIG. 1, the power supply system 1 includes a power supply unit 10, a switch unit 12, a connection unit 14, a first in-vehicle load 16a, a second in-vehicle load 16b, an input unit 18, an output unit 20, and a processing unit 22.

In FIG. 1, the first in-vehicle load 16a and the second in-vehicle load 16b are illustrated, but the power supply system 1 includes a larger number of in-vehicle loads (not illustrated). Hereinafter, a plurality of in-vehicle loads including the first in-vehicle load 16a and the second in-vehicle load 16b will be collectively referred to as an in-vehicle load 16 as appropriate.

The power supply unit 10 supplies electric power to the connection unit 14 and the plurality of in-vehicle loads 16 via the switch unit 12. The power supply unit 10 includes, for example, an auxiliary battery (not shown), which is a rechargeable secondary battery. The power supply unit 10 is capable of outputting the electric power stored in the auxiliary battery. Various known configurations can be adopted as the power supply unit 10. The power supply unit 10 may include an alternator or a power converter such as a DC/DC converter. The power supply unit 10 may make the voltage supplied to the connection unit 14 different from the voltage supplied to the plurality of in-vehicle loads 16.

The switch unit 12 can individually control the current flowing from the power supply unit 10 to the connection unit 14 and the current flowing from the power supply unit 10 to each of the plurality of in-vehicle loads 16.

The switch unit 12 includes a first semiconductor switch 30a, a second semiconductor switch 30b, a third semiconductor switch 30c, a first current detection unit 32a, a second current detection unit 32b, and a third current detection unit 32c. The switch unit 12 may include more semiconductor switches and a current detection unit (not shown). Hereinafter, a plurality of semiconductor switches including the first semiconductor switch 30a, the second semiconductor switch 30b, and the third semiconductor switch 30c will be collectively referred to as a semiconductor switch 30 as appropriate. Also, a plurality of current detection units including the first current detection unit 32a, the second current detection unit 32b, and the third current detection unit 32c are collectively referred to as the current detection unit 32 as appropriate.

Each of the plurality of semiconductor switches 30 is, for example, a metal-oxide-semiconductor field effect transistor (MOSFET). Further, the plurality of semiconductor switches 30 have one end to which the output power of the power supply unit 10 is supplied, the other end electrically connected to one end of the corresponding current detection unit 32, and a control terminal to which a control signal is supplied from the processing unit 22.

The other end of the first current detection unit 32a is electrically connected to the connection unit 14. The first current detection unit 32a detects a current flowing from the power supply unit 10 to the external load 70 via the connection unit 14, and supplies information on the detected current value to the processing unit 22.

The other end of the second current detection unit 32_b_ is electrically connected to the first in-vehicle load 16_a_. The second current detection unit 32_b_ detects a current flowing from the power supply unit 10 to the first in-vehicle load 16_a_, and supplies the detected current to the processing unit 22.

The other end of the third current detection unit 32_c_ is electrically connected to the second in-vehicle load 16_b_. The third current detection unit 32_c_ detects a current flowing from the power supply unit 10 to the second in-vehicle load 16_b_, and supplies the detected current to the processing unit 22.

The connection unit 14 is a port through which a user can electrically connect the external load 70, and supplies power to the external load 70. The connection unit 14 is a connector to which the power connector 72 of the external load 70 can be connected. The external load 70 is an external device that is not a component of the vehicle, and is a variety of electrical devices including, for example, a mobile terminal. The connection unit 14 can also be referred to as an external power supply port or an external power supply port. The connection unit 14 is, for example, a cigarette socket, a universal serial bus (USB) or an accessory outlet provided in a vehicle cabin. The accessory outlet is capable of supplying AC power. When the connection unit 14 is an accessory outlet, the power supply unit 10 is configured to supply AC power to the accessory outlet. A plurality of connection units 14 may be provided. The connection unit 14 may be provided in the body of the vehicle, and may be electrically connectable to an external load used outside the vehicle.

The plurality of in-vehicle loads 16 are electric loads provided in the vehicle and are components of the vehicle. The plurality of in-vehicle loads 16 may include, for example, headlamps, turn indicators, navigational devices, audio devices, air conditioners, defoggers, seat heaters, wipers, various electronic control units (ECUs), and the like. The in-vehicle load 16 operates using electric power supplied from the power supply unit 10. The in-vehicle load 16 may also be referred to as a vehicle electrical component or an auxiliary load.

The input unit 18 includes, for example, a switch provided on a steering wheel of the vehicle, and is a device to which various operations of the user are input. The input unit 18 outputs an operation signal generated by a user operation to the processing unit 22. The input unit 18 may be another input device such as a touch sensor to which a user's operation is input.

The output unit 20 includes at least one of a display unit and a speaker provided in the vehicle cabin, and outputs various kinds of information to the user by at least one of display and sound in accordance with an instruction from the processing unit 22. The display unit includes, for example, a multi information display (MID) provided in an instrument cluster in the vehicle cabin. The display includes, for example, an image and characters representing a message. The indicator may include an indicator formed of a light emitting diode (LED) or the like provided near the connection unit 14.

The processing unit 22 controls the switch unit 12. The processing unit 22 includes a control unit 40, a notification unit 42, and a receiving unit 44. The configuration of the processing unit 22 can be realized by a CPU, a memory, or another LSI of any computer in terms of hardware, and can be realized by a program loaded in the memory in terms of software, or the like. On the other hand, the functional blocks realized by the cooperation are illustrated here. Therefore, it is understood by those skilled in the art that these functional blocks can be implemented in various forms by hardware only, by software only, or by a combination of hardware and software.

For example, when the output voltage of the power supply unit 10 detected by a voltage sensor (not shown) is less than a predetermined voltage threshold, the control unit 40 controls the switch unit 12 to limit the current flowing through the predetermined in-vehicle load 16 among the plurality of in-vehicle loads 16. Voltage thresholds can be determined as appropriate by experimentation or simulation. The fact that the output voltage of the power supply unit 10 becomes less than the voltage threshold corresponds to the fact that state of charge (SOC) of the auxiliary battery of the power supply unit 10 becomes less than the threshold. In this case, the control unit 40 controls the control voltage supplied to the control terminal of the semiconductor switch 30 connected to the predetermined in-vehicle load 16 to limit the current flowing through the semiconductor switch 30. The predetermined in-vehicle load 16 is a load that does not directly affect the traveling of the vehicle even if the current is reduced, and is, for example, an air conditioner.

When a large number of in-vehicle loads 16 and external loads 70 continue to operate with relatively large current consumption, that is, when the power used in the vehicle continues to be relatively too large, the output voltage of the power supply unit 10 may decrease to be less than the voltage threshold. In this case, by this control, for example, the current supplied to the air conditioner is reduced, the air volume is reduced, the power used in the vehicle is reduced, and the output voltage of the power supply unit 10 is easily recovered to a voltage threshold value or more by charging. Accordingly, it is possible to prevent the operation of the in-vehicle load 16 that directly affects the traveling of the vehicle from being affected. Various known techniques can be used for this control.

When the current flowing through the external load 70 detected by the first current detection unit 32_a_ is equal to or larger than the current interruption threshold value, the control unit 40 controls the switch unit 12 to interrupt the current flowing from the power supply unit 10 to the external load 70. The current interruption threshold value can be appropriately determined by experiment or simulation so that smoke generation of the electric wire between the switch unit 12 and the connection unit 14 can be suppressed. In this case, the control unit 40 controls the control voltage supplied to the control terminal of the first semiconductor switch 30_a_ to switch the first semiconductor switch 30_a_ from the conductive state to the non-conductive state so that no current flows through the first semiconductor switch 30_a_.

When the current flowing through the external load 70 detected by the first current detection unit 32_a_ is equal to or larger than the rated current, the notification unit 42 notifies the user via the output unit 20 of attention indicating that the consumed current of the external load 70 is large. The attention information may include information indicating that the current of the external load 70 is restricted or interrupted at a later time. Attention information can also be called warning. The rated current is a value smaller than the current interruption threshold value and is predetermined. The notification unit 42 does not notify the attention information when the current flowing through the external load 70 is less than the rated current.

For example, the notification unit 42 may notify the attention information when a predetermined first time elapses in a state in which the detected current is equal to or higher than the rated current. The first time period may be, for example, on the order of a few seconds, and may be appropriately determined by experiment or simulation. By waiting for the elapse of the first time, it is possible to prevent notification of the attention information when the current becomes equal to or more than the rated current for a short time, such as immediately after the external load 70 is connected.

For example, the notification unit 42 may control MID of the output unit 20 to notify the attention information by at least one of images and characters such as "power consumed by external loads is too large".

The notification unit 42 may control the indicator of the output unit 20 to change the display mode of the indicator to notify the attention information. As a change in the display mode, for example, the display color of the indicator may be changed, or the display mode may be changed from the continuous display to the blinking display.

The notification unit 42 may control the speaker of the output unit 20 to notify the attention information by a warning sound, or may notify the attention information by a sound such as "the power consumption of the external load is too large".

The user who has received the notification of the attention information can recognize that the output current from the connection unit 14 is too large and the power consumption of the connected external load 70 is too large. Accordingly, the user can determine whether it is necessary to take measures such as removing the external load 70 from the connection unit 14.

When a predetermined second time longer than the first time has elapsed in a state where the detected current is equal to or more than the rated current, the control unit 40 controls the switch unit 12 to limit the current flowing from the power supply unit 10 to the external load 70 to less than the rated current. In this case, the control unit 40 may limit the current flowing from the power supply unit 10 to the external load 70 to a predetermined limit current that is less than the rated current. The control unit 40 controls the control voltage supplied to the control terminal of the first semiconductor switch 30a to limit the current flowing through the first semiconductor switch 30a to the limiting current. When the second time has not elapsed in a state in which the detected current is equal to or higher than the rated current, the control unit 40 does not limit the current flowing from the power supply unit 10 to the external load 70. The second time period may be, for example, on the order of a few seconds, and may be appropriately determined by experiment or simulation. The limiting current can be determined as appropriate by experimentation or simulation.

When the user who recognizes the attention information removes the external load 70 or does not stop the operation of the external load 70, the current of the external load 70 can be limited, so that the power used in the vehicle can be reduced. Therefore, since the amount of electric power used in the vehicle is too large, it is possible to suppress the current of a predetermined in-vehicle load 16 such as an air conditioner from being unintentionally limited. In addition, it is possible to prevent the current of the external load 70 from being limited in a situation where the user does not recognize the output of the attention information.

When the current flowing from the power supply unit 10 to the external load 70 is limited by the control unit 40, the notification unit 42 may notify the user of information indicating that the current supplied to the external load 70 is being limited via the output unit 20.

Alternatively, when the second time elapses in a state where the detected current is equal to or higher than the rated current, the control unit 40 may control the switch unit 12 to interrupt the current flowing from the power supply unit 10 to the external load 70.

By this control, when the user who recognizes the attention information does not remove the external load 70 or stop the operation of the external load 70, the current of the external load 70 can be interrupted, so that the power used in the vehicle can be further reduced. Therefore, since the amount of electric power used in the vehicle is too large, it is possible to suppress the current of a predetermined in-vehicle load 16 such as an air conditioner from being unintentionally limited. Further, it is possible to prevent the current of the external load 70 from being interrupted in a situation where the user does not recognize the output of the attention information.

When the current flowing from the power supply unit 10 to the external load 70 is interrupted by the control unit 40, the notification unit 42 may notify the user of information indicating that the current of the external load 70 has been interrupted via the output unit 20.

Whether the control unit 40 limits or cuts off the current flowing from the power supply unit 10 to the external load 70 may be switchable in accordance with a setting operation of the user, or may be set in advance at the time of manufacturing the vehicle.

Here, as will be described below, the power supply system 1 may limit the current flowing to the in-vehicle load 16 that is the selected restriction target when the user selects the in-vehicle load 16 that is the restriction target.

The notification unit 42 derives electric power supplied to each of the plurality of in-vehicle loads 16 and the external load 70 based on the current supplied to each of the plurality of in-vehicle loads 16 and the external load 70 and the output voltage of the power supply unit 10. The notification unit 42 notifies the user of information related to the power supplied to each of the plurality of in-vehicle loads 16 and the external load 70, which has been derived, via the output unit 20.

For example, the notification unit 42 notifies the electric power consumed by each of the plurality of in-vehicle loads 16 and the external load 70 via MID of the output unit 20 by images or characters. The notification unit 42 may notify the power consumption via the power consumption indicator of the output unit 20. The notification unit 42 may notify the in-vehicle load 16 of the power consumption only to the plurality of in-vehicle loads 16 that are the restriction target candidates. The plurality of in-vehicle loads 16 of the restriction target candidate are loads that do not directly affect the traveling of the vehicle even if the current is reduced, and include, for example, a defogger, a seat heater, a navigation device, an audio device, and the like in addition to the air conditioner. The in-vehicle loads 16 of the restricted candidates do not include loads that can directly affect the driving of the vehicles by reducing currents such as, for example, engine ECU, hybrid ECU, braking ECU, and steering ECU.

When the sum of the electric power supplied to the plurality of in-vehicle loads 16 and the external load 70 (hereinafter referred to as the sum of the electric power of the in-vehicle load 16 and the like) is equal to or greater than a predetermined power threshold value, the notification unit 42 notifies the user of attention information indicating that the electric power used in the vehicle is large via the output unit 20. The power threshold can be determined as appropriate by experimentation or simulation.

When the state in which the sum of the electric power of the in-vehicle load 16 or the like is equal to or higher than the electric power threshold continues, as described above, there is a possibility that the output voltage of the power supply unit 10 decreases below the voltage threshold, and the current flowing through the air conditioner that is the predetermined in-vehicle load 16 may be limited.

The receiving unit 44 receives a user operation on the input unit 18 that selects the in-vehicle load 16 to be restricted from the plurality of in-vehicle loads 16 as the restriction target candidates, and supplies information on the received user operation to the control unit 40. When the receiving unit 44 receives a user operation of selecting the in-vehicle load 16 to be restricted, the control unit 40 controls the switch unit 12 to limit the current flowing from the power supply unit 10 to the in-vehicle load 16 to be restricted selected by the user operation.

For example, it is assumed that, when the user connects the external load 70 to the connection unit 14 during the operation of the plurality of in-vehicle loads 16 including the air conditioner and the defogger, attention information indicating that there is a large amount of electric power used in the vehicle is notified. For example, it is assumed that the current flowing through the external load 70 is less than the rated current. It is assumed that a user who has received attention information indicating that there is a large amount of electric power used in a vehicle does not want to continue to operate the in-vehicle load 16 in operation and supply power to the external load 70, but does not want to avoid the current limitation of the air conditioner. Therefore, the user confirms the list of the power consumption displayed on MID, and operates the input unit 18 to select a defogger having a relatively large power consumption as the in-vehicle loads 16 to be restricted. The control unit 40 limits the current supplied to the selected defogger. Accordingly, when the sum of the electric power of the in-vehicle load 16 or the like becomes less than the electric power threshold, the output voltage of the power supply unit 10 is less likely to decrease to be less than the voltage threshold, and it is possible to avoid limiting the current of the air conditioner.

As described above, the current flowing through the in-vehicle load 16 as the restriction target selected by the user operation is limited, so that the power used in the vehicle can be reduced. Therefore, since the amount of electric power used in the vehicle is too large, it is possible to suppress the current of the predetermined in-vehicle load 16 unintended by the user from being limited by the control unit 40.

Figure 2:
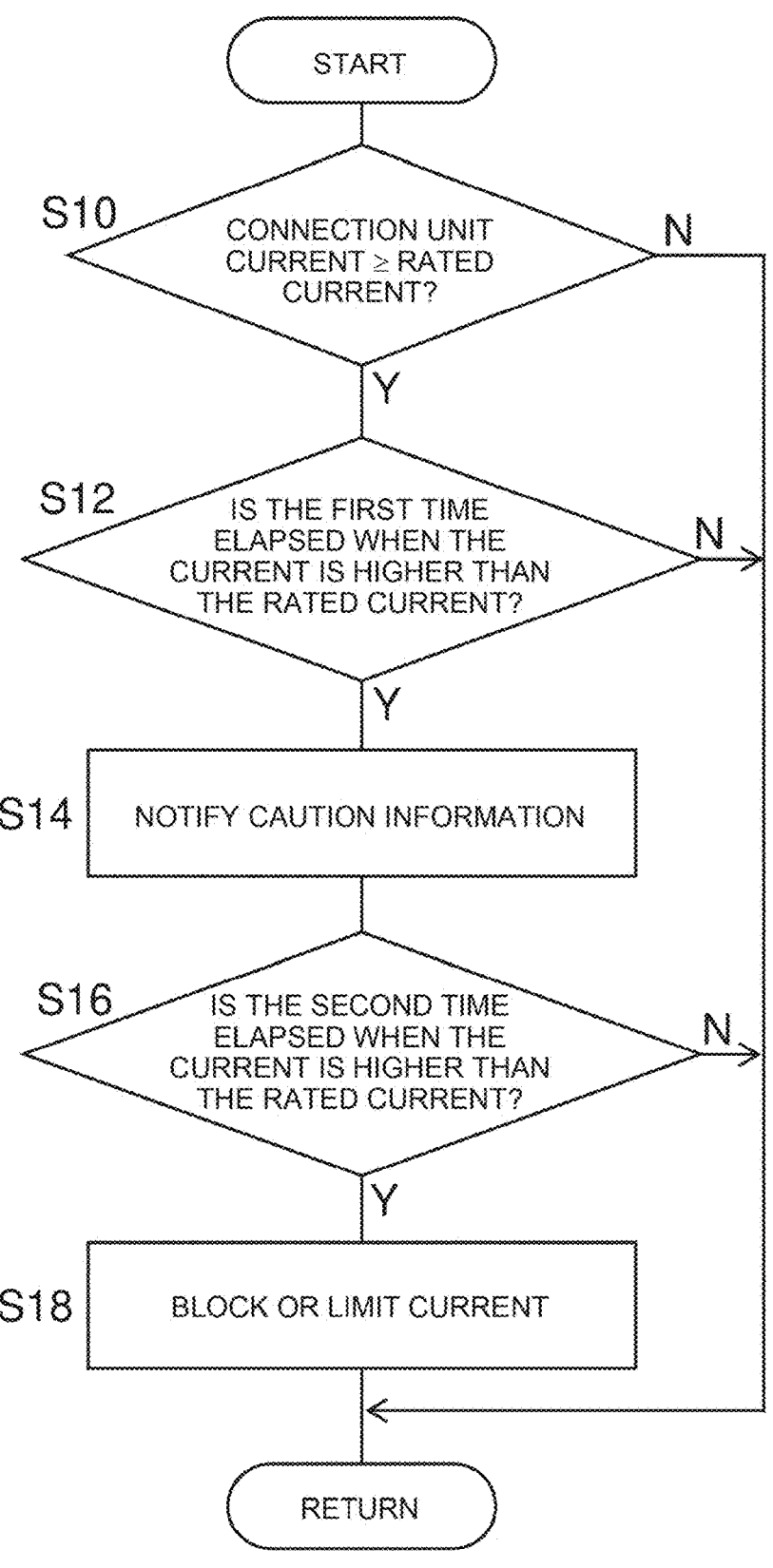
FIG. 2 is a flowchart illustrating a process related to power supply to the connection unit of FIG. 1.

Next, an overall operation of the power supply system 1 having the above-described configuration will be described. FIG. 2 is a flowchart illustrating a process related to power supply to the connection unit 14 of FIG. 1. The process of FIG. 2 is started when the external load 70 is connected to the connection unit 14, and is ended when the external load 70 is removed from the connection unit 14.

When the current of the connection unit 14 is equal to or more than the rated current (Y in S10), if the first period of time has elapsed while the current is equal to or more than the rated current (Y in S12), the notification unit 42 notifies the attention information (S14). When the second time has elapsed while the current is equal to or higher than the rated current (Y in S16), the control unit 40 controls the switch unit 12 to interrupt or limit the current of the connection unit 14 (S18), and the process returns to S10.

When the current of the connection unit 14 is less than the rated current in S10 (N in S10), the process returns to S10. When the first period has not elapsed in S12 when the current is equal to or higher than the rated current (N in S12), the process returns to S10. When the second period has not elapsed in S16 when the current is equal to or higher than the rated current (N in S16), the process returns to S10.

According to the embodiment, since the attention information is notified to the user when the current flowing through the external load 70 is equal to or higher than the rated current, it is possible to notify the user that the output current from the connection unit 14 is too large. Therefore, it is possible to cope with a situation in which the external load 70 having a large current consumption is connected to the connection unit 14 of the vehicle by the user.

The present disclosure has been described with reference to the embodiments. Note that the embodiments are merely an example. It is to be understood by those skilled in the art that various modifications are possible by combining the components and the processing processes and that such modifications are also within the scope of the present disclosure.

What is claimed is:

1. A power supply system that is mounted in a vehicle, the power supply system comprising:
   a power port configured to connect an external load;
   a battery configured to supply power to the external load via the power port;
   a sensor configured to detect a current flowing from the battery to the external load;
   a display configured to notify a user of caution information in a case where the detected current is equal to or greater than a rated current; and
   a processor configured to:
       determine whether a total amount of power supplied to the external load and a plurality of in-vehicle loads is equal to or greater than a first predetermined power threshold value, the plurality of in-vehicle loads being components of the vehicle,
       in a case where the total amount of the power supplied to the external load and the plurality of in-vehicle loads is equal to or greater than a first predetermined power threshold value:
       notify the user of power consumed by the external load and the plurality of in-vehicle loads using images or characters via the display;
       receive a user operation that selects one in-vehicle load among the plurality of in-vehicle loads to be limited; and
       limit a current flowing to the in-vehicle load selected by the user operation.

2. The power supply system according to claim 1, wherein the display is configured to notify the user of the caution information in a case where a predetermined first time period elapses in a state where the detected current is equal to or greater than the rated current.

3. The power supply system according to claim 2, wherein the processor is further configured to limit the current flowing to the external load to less than the rated current in a case where a predetermined second time period elapses in a state where the detected current is equal to or greater than the rated current, the predetermined second time period is longer than the predetermined first time period.

4. The power supply system according to claim 2, wherein the processor is configured to block the current flowing to the external load in a case where a predetermined second time period elapses in a state where the detected current is equal to or greater than the rated current, the predetermined second time period is longer than the predetermined first time period.

* * * * *